United States Patent
Ishizuya et al.

(10) Patent No.: US 11,527,579 B2
(45) Date of Patent: Dec. 13, 2022

(54) DISPLAY DEVICE AND IMAGE PICKUP APPARATUS

(71) Applicant: CANON KABUSHIKI KAISHA, Tokyo (JP)

(72) Inventors: Koji Ishizuya, Fujisawa (JP); Tetsuo Takahashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/066,276

(22) Filed: Oct. 8, 2020

(65) Prior Publication Data
US 2021/0028240 A1 Jan. 28, 2021

Related U.S. Application Data

(63) Continuation of application No. 16/369,868, filed on Mar. 29, 2019, now Pat. No. 10,833,130.

(30) Foreign Application Priority Data

Apr. 3, 2018 (JP) .............................. JP2018-071661

(51) Int. Cl.
*H01L 27/32* (2006.01)
(52) U.S. Cl.
CPC .................................. *H01L 27/322* (2013.01)
(58) Field of Classification Search
CPC .................................................... H01L 27/322
See application file for complete search history.

(56) References Cited

U.S. PATENT DOCUMENTS

| 2003/0107314 A1* | 6/2003 | Urabe ................... H01L 27/322 |
| | | 313/506 |
| 2015/0236074 A1 | 8/2015 | Akagawa |
| 2017/0104045 A1 | 4/2017 | Hanamura |
| 2018/0138376 A1 | 5/2018 | Koshihara |

FOREIGN PATENT DOCUMENTS

| JP | 2005093398 A | 4/2005 |
| JP | 2007149693 A | 6/2007 |
| JP | 2013-20744 A | 1/2013 |
| JP | 2015050096 A | 3/2015 |
| JP | 2015153607 A | 8/2015 |
| JP | 2016054138 A | 4/2016 |

* cited by examiner

*Primary Examiner* — Lauren R Bell
(74) *Attorney, Agent, or Firm* — Canon U.S.A., Inc. IP Division

(57) ABSTRACT

A display device according to an embodiment of the present invention includes first and second electroluminescent elements on a substrate. The first and second electroluminescent elements each include a lower electrode, a functional layer including a light-emitting layer, an upper electrode, and a first or second color filter. The display device includes an overlapping region where the first and second color filters overlap each other in a plan view. Light transmitted through the first color filter has a higher luminosity factor than light transmitted through the second color filter. L2>L1, wherein L2 is the distance between the light-emitting region of the second electroluminescent element and the second color filter, and L1 is the distance between the light-emitting region of the first electroluminescent element and the first color filter.

10 Claims, 11 Drawing Sheets

DISPLAY DEVICE AND IMAGE PICKUP APPARATUS

CROSS-REFERENCE TO RELATED APPLICATIONS

This application is a Continuation of U.S. application Ser. No. 16/369,868, filed Mar. 29, 2019, which claims the benefit of priority from Japanese Patent Application No. 2018-071661, filed Apr. 3, 2018, each of which is hereby incorporated by reference herein in their entirety.

BACKGROUND OF THE INVENTION

Field of the Invention

Embodiments of the present invention relate to a display device including multiple electroluminescent elements, and an image pickup apparatus including the display device.

Description of the Related Art

Organic electroluminescent elements are light-emitting elements each including a pair of electrodes and an organic compound layer disposed therebetween. Organic electroluminescent elements are being put to practical use as light-emitting elements such as light sources for thin-screen displays, lighting equipment, head-mounted displays, print heads of electrophotographic printers, and so forth by taking advantage of their advantageous characteristics such as surface light-emitting characteristics, light weight, and visibility.

In particular, there is a growing demand for higher definition organic electroluminescent display devices. A system, including organic electroluminescent elements, that emits white light and color filters (hereinafter, referred to as a "white+CF system") is known. In the white+CF system, multiple color filters having different chromatic dispersions to light absorbed are disposed in the direction in which white light is emitted from the organic electroluminescent elements. For example, the color filters are disposed in such a manner that the emission colors of light that has passed through the color filters are one of red, green, and blue, thereby enabling full-color display by additive color mixing. In the white+CF system, an organic compound layer need not be formed for each pixel. It is thus easy to provide higher-definition pixels.

An organic electroluminescent element of the white+CF system, however, has the problem of decreasing color purity of emission colors. As one of the factors of the problem, it is known that when a pixel of a certain color emits light, stray light can be emitted through the color filter of one or more adjacent pixels.

FIG. 7 illustrates an organic electroluminescent display device in the related art. The organic electroluminescent display device includes a first organic electroluminescent element and a second organic electroluminescent element. In organic electroluminescent elements, it is widely known that about 80% of emitted light acts as guided light that propagates through an organic compound layer and a sealing layer. The guided light propagates in the organic electroluminescent display device in the horizontal direction by the reflection of the light from surfaces of a lower electrode, a substrate, an insulating layer, and so forth and surfaces of an upper electrode and the sealing layer on the outgoing light side.

When the surfaces of the lower and upper electrodes are parallel to the substrate, the guided light propagates easily in the horizontal direction. When a structure that is not parallel to the substrate is provided, the guided light is reflected, refracted, or scattered to generate stray light. A portion of the stray light propagates from the position of the structure in the direction perpendicular to the substrate, i.e., in the direction in which light is emitted. As illustrated in FIG. 7, for example, a portion of the light emitted from the second organic electroluminescent element acts as stray light at inclined portions of the first organic electroluminescent element and passes through a first color filter. In this case, the outgoing light includes light transmitted through a second color filter and light transmitted through the first color filter, thus decreasing the color purity of the second organic electroluminescent element.

Japanese Patent Laid-Open No. 2013-20744 discloses an organic electroluminescent display device including a light-shielding metal layer on color filters, end portions of adjacent color filters being overlapped with each other, thereby reducing color mixture.

In the organic electroluminescent display device disclosed in Japanese Patent Laid-Open No. 2013-20744, the light-shielding metal layer is disposed on portions where two types of color filters are overlapped with each other. This results in a reduction in color mixture.

Depending on the structure of the display device, optical reflection from the light-shielding metal layer and an influence on a protective layer need to be taken into consideration, leaving room for improvement.

The increase in size of overlapping regions of color filters can improve the color purity of an emission color. If, however, the overlapping regions of all the color filters are increased in size, the aperture ratio and the luminance are decreased; thus, improvement is desired.

SUMMARY OF THE INVENTION

The present invention provides an organic electroluminescent display device having a reduced decrease in aperture ratio and a wide color gamut.

One aspect of the present invention is directed to providing a display device that includes a substrate, a first electroluminescent element, and a second electroluminescent element disposed next to the first electroluminescent element, the first electroluminescent element including a lower electrode, a light-emitting layer, an upper electrode, and a first color filter, disposed in that order from the substrate, the second electroluminescent element including a lower electrode, a light-emitting layer, an upper electrode, and a second color filter, disposed in that order from the substrate, the display device including an overlapping region where the first color filter and the second color filter overlap each other in a plan view of the display device when viewed in a direction perpendicular to a main surface of the substrate, in which light transmitted through the first color filter has a higher luminosity factor than light transmitted through the second color filter, and L2>L1, where L2 is the distance between an end portion of a light-emitting region of the second electroluminescent element adjacent to the first color filter and an end portion of the second color filter adjacent to the first electroluminescent element, and L1 is the distance between an end portion of a light-emitting region of the first electroluminescent element adjacent to the second color filter and an end portion of the first color filter adjacent to the second electroluminescent element.

Further features of the present invention will become apparent from the following description of exemplary embodiments with reference to the attached drawings. Each of the embodiments of the present invention described below can be implemented solely or as a combination of a plurality of the embodiments. Also, features from different embodiments can be combined where necessary or where the combination of elements or features from individual embodiments in a single embodiment is beneficial.

DESCRIPTION OF THE EMBODIMENTS

A display device according to an embodiment of the present invention includes a light-emitting layer that emits white light. The display device addresses a decrease in color gamut caused by allowing a portion of the white light to become guided light and allowing the guided light to emerge from an adjacent pixel. A color filter that transmits light having a low luminosity factor is disposed closer to a light-emitting region of an adjacent pixel. It can be said that the color filter that transmits light having a low luminosity factor has a larger width than other color filters.

The display device according to this embodiment includes, on a substrate, a first electroluminescent element having a first color filter and a second electroluminescent element having a second color filter, and an overlapping region where the first color filter and the second color filter overlap with each other in a plan view.

Light transmitted through the first color filter may have a higher luminosity factor than light transmitted through the second color filter.

The distance L2 between an end portion of the light-emitting region of the second electroluminescent element adjacent to the first color filter and an end portion of the second color filter adjacent to the first electroluminescent element is larger than the distance L1 between an end portion of the light-emitting region of the first electroluminescent element adjacent to the second color filter and an end portion of the first color filter adjacent to the second electroluminescent element.

In this specification, the term "plan view" refers to a view when viewed in the direction perpendicular to a main surface of the substrate.

The use of the color filter that transmits light having a low luminosity factor and that has a large area narrows a region where light is transmitted through only the color filter that transmits light having a high luminosity factor and emitted from the region. This prevents stray light in the display device from emerging as light having a high luminosity factor. Thus, the display device has a good color gamut.

In the display device according to this embodiment, L2 may be at least 25% larger than L1. The percentage is calculated by (L2−L1)/L1. Preferably, L2 is at least 75% larger than L1.

L2 may be at least 0.2 m larger than L1. Preferably, L2 is at least 0.6 m larger than L1.

Organic Electroluminescent Element According to Embodiment

Organic electroluminescent display devices according to embodiments of the present invention will be described below with reference to the attached drawings. Well-known or publicly known techniques in the art are applied to components that are not specifically illustrated or described herein. The present invention is not limited to these embodiments described below.

Figure 1:
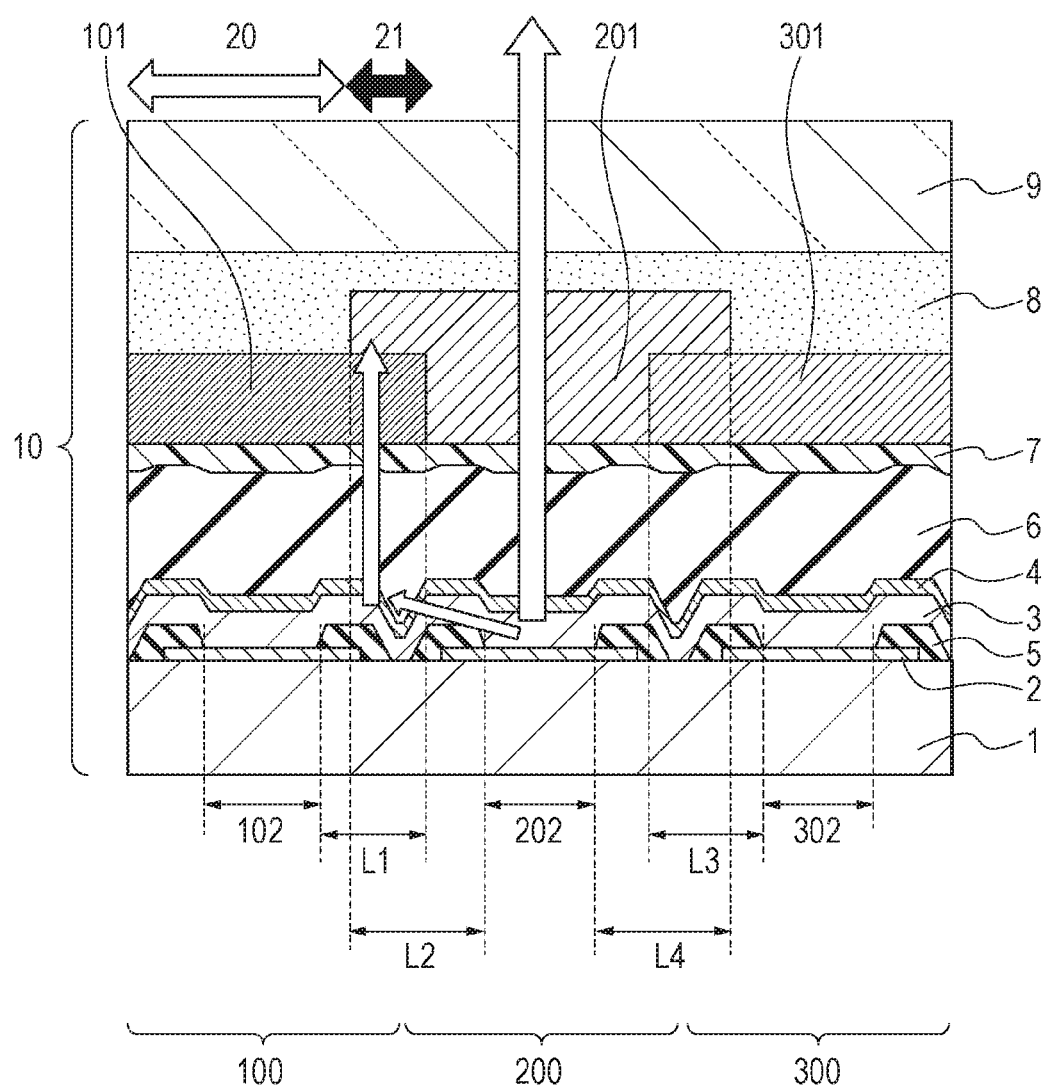
FIG. 1 is a schematic cross-sectional view of an example of an organic electroluminescent display device according to an embodiment of the present invention.

FIG. 1 is a schematic cross-sectional view of an example of an organic electroluminescent display device according to an embodiment of the present invention. While the electroluminescent element is described as an organic electroluminescent element, the electroluminescent element is not limited thereto. The display device 10 illustrated in FIG. 1 includes a first organic electroluminescent element 100 and a second organic electroluminescent element 200 on a substrate 1. Each of the first organic electroluminescent element 100 and the second organic electroluminescent element 200 includes a lower electrode 2, an organic compound layer 3 including a light-emitting layer, an upper electrode 4, and a color filter.

A first color filter 101 may be disposed on the outgoing light side of the upper electrode of the first organic electroluminescent element 100. A second color filter 201 may be disposed on the outgoing light side of the upper electrode of the second organic electroluminescent element. The first color filter 101 may be disposed so as to overlap with a first light-emitting region 102 in a plan view. The second color filter 201 may be disposed so as to overlap with a second light-emitting region 202 in a plan view.

In FIG. 1, the first color filter is overlapped with the second color filter so as to be located closer to the substrate than the second color filter. However, the second color filter may be overlapped with the first color filter so as to be located closer to the substrate than the first color filter.

The first color filter and the second color filter may be overlapped with each other in a plan view and need not be in contact with each other. In the case where the first color filter and the second color filter may be in contact with each other, color mixture is more easily inhibited.

The effect of overlapping the first color filter 101 with the second color filter 201 in a plan view will be described below.

A portion of the light emerging from the second light-emitting region is emitted to the outside of the organic electroluminescent display device through the second color filter. A portion of the light emerging from the second light-emitting region is reflected, refracted, and scattered at inclined portions of the organic electroluminescent display device to become stray light.

Specifically, the inclined portions are portions that are not parallel to the substrate and listed as follows: for example, end portions of the lower electrodes, aperture portions of an insulating layer, and portions of the organic compound layer, the upper electrode, and the sealing layer along inclined portions of the end portions of the lower electrodes and the aperture portions of the insulating layer.

A portion of stray light propagating in the direction perpendicular to the substrate passes through the first color filter and then travels to the second color filter. The first color filter and the second color filter have different chromatic dispersions to light absorbed. Thus, the portion of the stray light is absorbed by the second color filter. Because no stray light emerges from the first color filter, the second organic electroluminescent element has improved color purity.

In the case where the overlapping regions of the color filters of all the organic electroluminescent elements are increased in size, regions of the color filters that transmit light emitted are decreased in size, and thus the organic electroluminescent display device tends to have decreased luminance. Accordingly, the overlapping regions of only some of the color filters may be increased in size.

Figure 8:
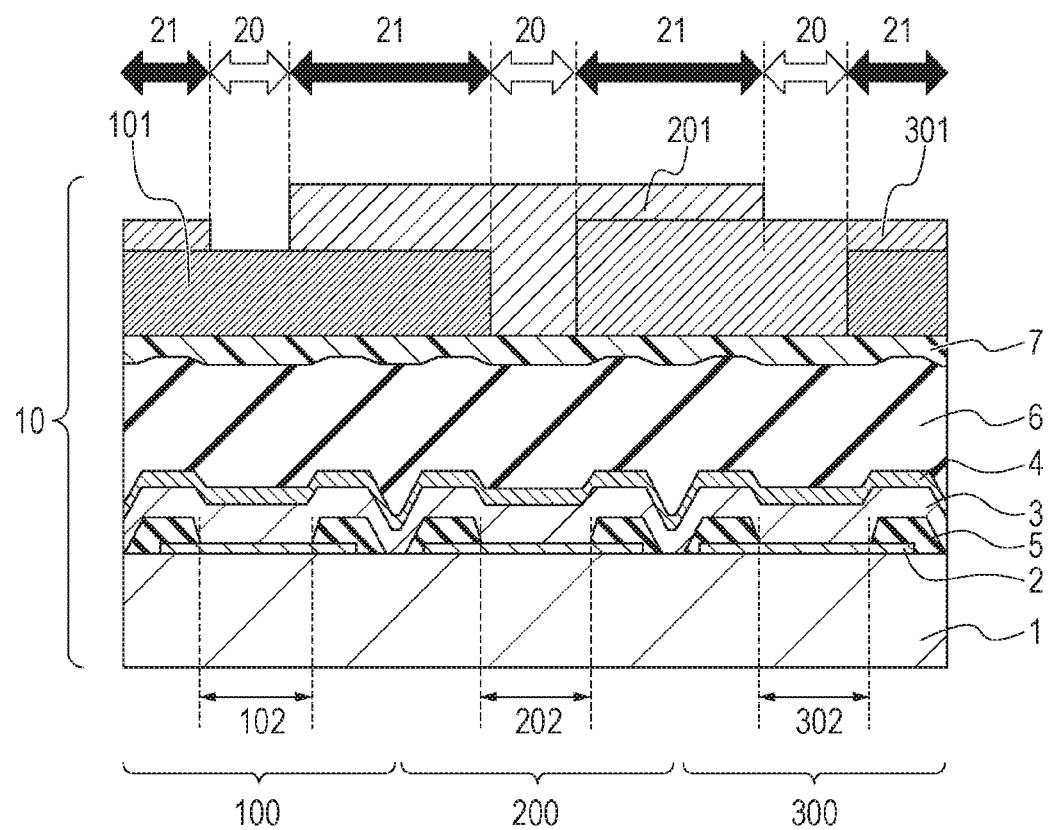
FIG. 8 is a cross-sectional view illustrating an example of a display device in the related art.

FIG. 8 is a cross-sectional view illustrating a display device according to a reference embodiment and is a conceptual cross-sectional view when overlapping regions of color filters of all electroluminescent elements are increased in size. Overlapping regions 21 where color filters having different chromatic dispersions to light absorbed are overlapped with each other function as light-shielding regions. Thus, when the overlapping regions of the color filters of all the organic electroluminescent elements are increased in size, the overlapping regions 21 are increased in size, and transmission regions 20 are decreased in size.

Figure 2:
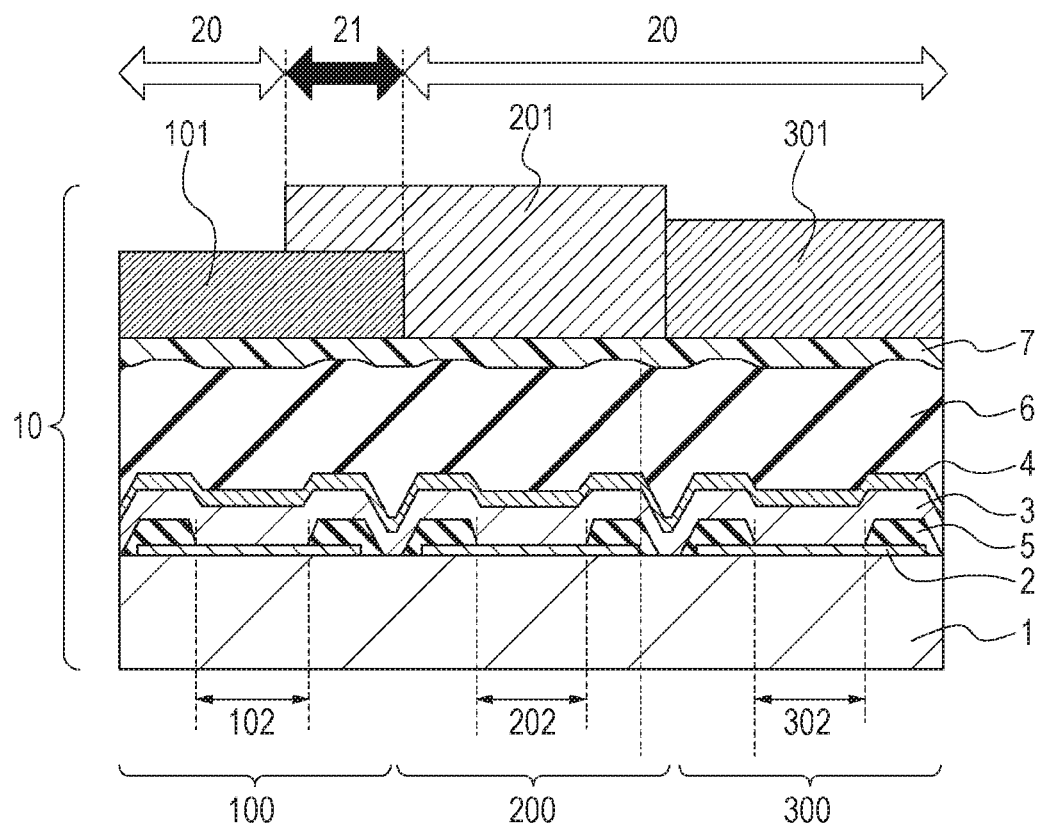
FIG. 2 is a schematic cross-sectional view illustrating a transmission region of a color filter of an organic electroluminescent display device according to an embodiment of the present invention.

In this case, the luminance is greatly decreased when viewed in the front direction or oblique direction. As illustrated in FIG. 2, in the case where the overlapping region of some color filters is increased in size, the transmission regions are large. Thus, a decrease in the luminance of the display device can be reduced.

The effects of color mixture on the emission color and a change in chromaticity will be described below.

Figure 3A:
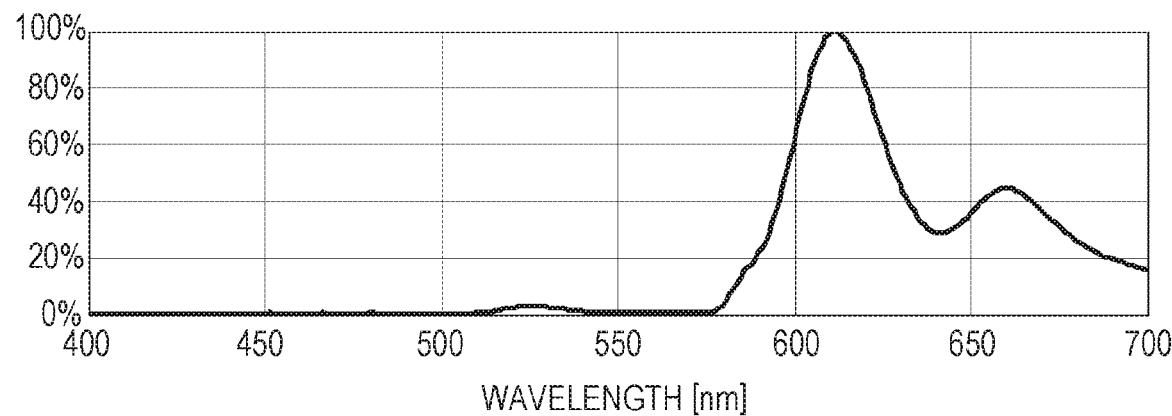
FIG. 3A is a graph illustrating an emission spectrum.
Figure 3B:
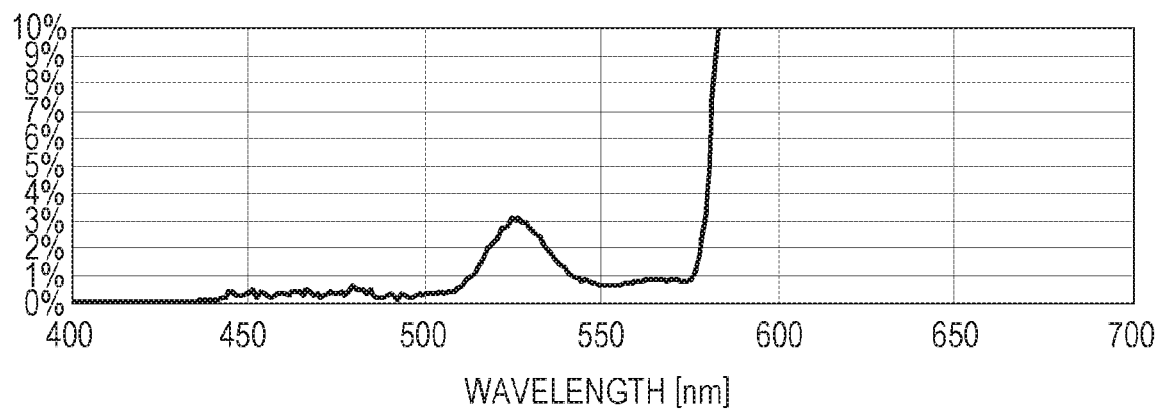
FIG. 3B is an enlarged view of a low-intensity portion of the spectrum illustrated in FIG. 3A.

FIGS. 3A and 3B illustrate an emission spectrum when green light is mixed with red light so as to have an intensity of 3% of the emission peak intensity of the red light. In FIG. 3A, the red light has an emission peak at about 610 nm. FIG. 3B is an enlarged view of a low-intensity portion of the graph illustrated in FIG. 3A. The green light has an emission peak at about 525 nm, the emission peak having an intensity of 3% of the peak intensity of the red light. Such color mixture results in a decrease in the color purity of the emission color.

Table 1 presents Δu'v', which is a change in chromaticity u'v' when light of a different color from an emission color is mixed with light of the emission color so as to have an intensity of 3% of the emission peak intensity of the emission color. In the cases where green light is mixed with red light, green light is mixed with blue light, and red light is mixed with blue light, changes in chromaticity, i.e., Δu'v', are large. That is, in the case where light having a higher luminosity factor than light of the emission color is mixed, the change in chromaticity is large. In the case where light having a lower luminosity factor than light of the emission color is mixed, the change in chromaticity is equal to or less than half of that when light having a high luminosity factor is mixed.

As just described, the degree of influence on the chromaticity varies in accordance with the combination of the emission color and the color mixed.

TABLE 1

|  |  | Color mixed | | |
|---|---|---|---|---|
|  |  | Red | Green | Blue |
| Emission color | Red | — | 0.018 | 0.009 |
|  | Green | 0.006 | — | 0.005 |
|  | Blue | 0.020 | 0.031 | — |

The reason the degree of influence on the chromaticity varies in accordance with the combination of the emission color and the color mixed is that a higher luminosity factor of light of the color mixed than the luminosity factor of light of the emission color results in a greater degree of influence on the change in chromaticity.

The luminosity factor is also referred to as "spectral luminous efficacy" and indicates the brightness sensitivity of the human eye at a wavelength when the luminosity factor of light having a wavelength of about 555 nm, at which the maximum brightness sensitivity of the human eye is obtained, in vacuum is defined as 1. The average luminosity factor of many people, adopted by The International Commission on Illumination (usually abbreviated CIE for its French name, Commission Internationale de l'éclairage), is referred to as a luminous efficiency (spectral luminous efficiency).

In this specification, the luminosity factor can be estimated from the maximum peak wavelength of an emission spectrum and the luminous efficiency. Regarding the luminosity factor, green>red>blue.

Figure 4:
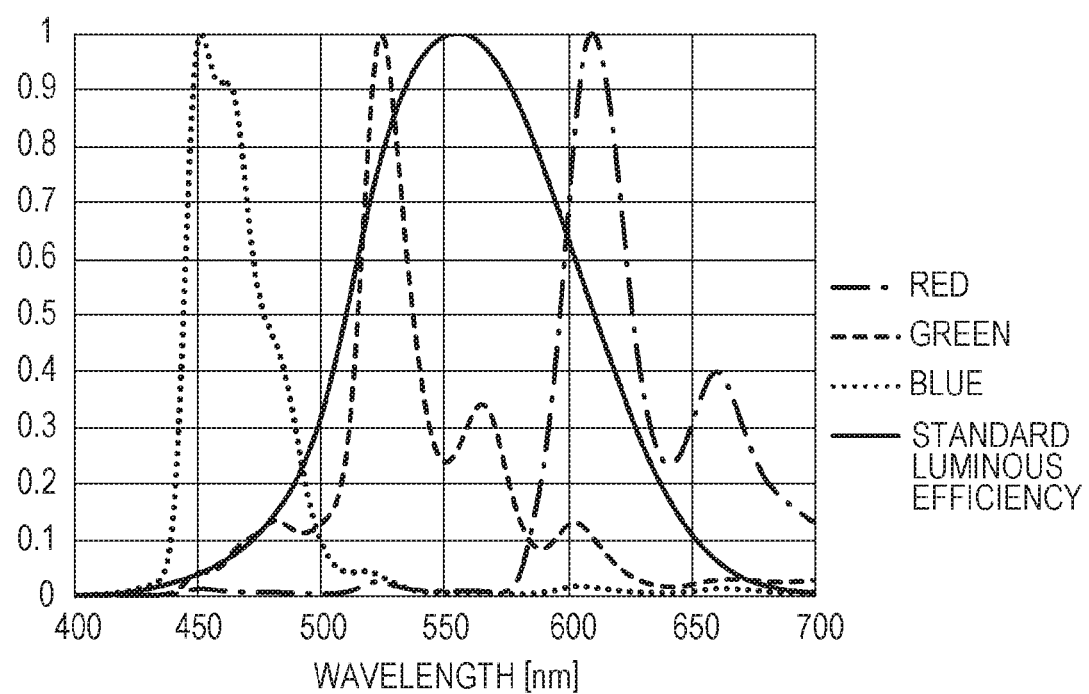
FIG. 4 illustrates a luminosity factor with respect to a luminous efficiency function.

Here, the definition of the luminosity factor of an emission spectrum will be described. FIG. 4 illustrates spectra of light beams passing through color filters. As an example, the light beams passing through the color filters are red, green, and blue in color, and the spectra of the light beams are illustrated. The resulting emission spectra are normalized to a peak intensity of 1. A value obtained by integrating the product of the emission spectra $EL(\lambda)$ and a luminous efficiency function $y(\lambda)$ for each wavelength is the luminosity factor Y of each emission spectrum. The mathematical expression is represented by formula (1):

$$Y = \int_{380}^{780} EL(\lambda) y(\lambda) d\lambda \qquad \text{formula (1)}$$

In FIG. 4, for example, the luminosity factor of the red emission spectrum is calculated to be 17, the luminosity factor of the green emission spectrum is calculated to be 31, and the luminosity factor of the blue emission spectrum is calculated to be 4, from formula (1).

In Table 1, a combination that causes a large change in chromaticity is the case where an emission color having a high luminosity factor is mixed with an emission color having a low luminosity factor.

Accordingly, in order to increase the effect of improving chromaticity without increasing the overlapping regions of all the color filters, the color mixture by use of the combination that causes a large change in chromaticity may be avoided. Specifically, the overlapping region of a color filter for an emission color having a low luminosity factor may be increased in size, and the mixture of an emission color having a high luminosity factor may be reduced.

As combinations of the emission color of the first organic electroluminescent element and the emission color of the second organic electroluminescent element, combinations described in Table 2 may be used in view of the luminosity factors.

TABLE 2

| First organic electroluminescent element | Second organic electroluminescent element |
|---|---|
| Green | Red |
| Green | Blue |
| Red | Blue |

The second color filter may be overlapped with steps of the first organic electroluminescent element adjacent to the second organic electroluminescent element in a plan view. As described above, guided light becomes stray light at the steps. Thus, the second color filter may be overlapped with the generation position of the stray light in a plan view.

An example of the steps of the electroluminescent elements includes the insulating layer that covers end portions of the lower electrodes. The formation of the steps by the insulating layer may affect members located on and above the lower electrodes.

Figure 5:
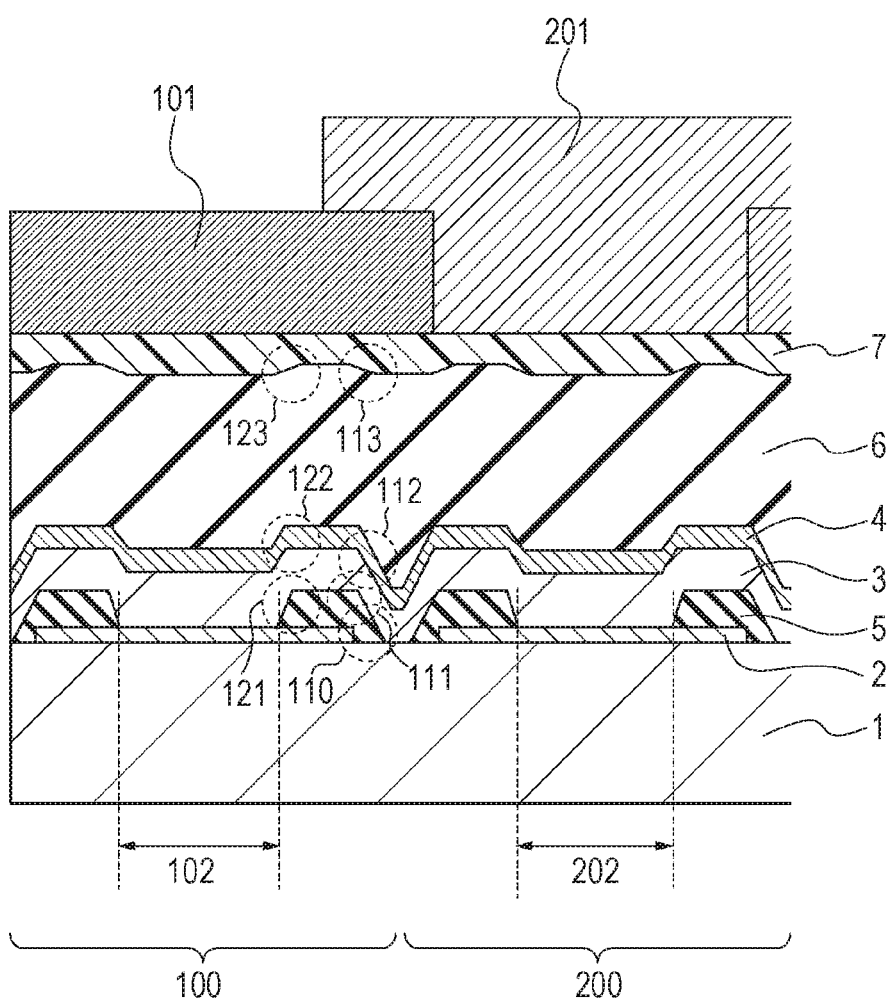
FIG. 5 is a schematic cross-sectional view illustrating examples of inclined portions in an organic electroluminescent display device according to an embodiment of the present invention.

FIG. 5 is a schematic cross-sectional view illustrating an example of the organic electroluminescent display device according to the embodiment. The second color filter may be overlapped with a step 110 at an end portion of the lower electrode 2 of the first organic electroluminescent element adjacent to the second organic electroluminescent element, a step 111 of an insulating layer 5 on the step 110, a step 112 of the organic compound layer or the upper electrode on the step 111, and a step 113 of a protective layer 6 on the step 112 in a plan view.

The second color filter may be overlapped with a step 121 of the aperture portion of the insulating layer 5 of the first organic electroluminescent element adjacent to the second organic electroluminescent element, a step 122 of the organic compound layer or the upper electrode on the step 121, and a step 123 of the protective layer 6 on the step 122 in a plan view.

Other Embodiments

A display device according to an embodiment may include a third organic electroluminescent element 300 adjacent to the second organic electroluminescent element 200. The third organic electroluminescent element 300 illustrated in FIG. 1 includes a third color filter 301. The third color filter transmits light having a wavelength different from light transmitted through the first color filter and light transmitted through the second color filter. In other words, the third color filter has a different chromatic dispersion from the first color filter and the second color filter.

The relationship between the first color filter 101 and the second color filter 201 may be applied to the relationship between the third color filter 301 and the second color filter 201.

Specifically, the third color filter 301 and the second color filter 201 are disposed so as to be overlapped with each other in a plan view. The distance L4 between an end portion of the second light-emitting region 202 adjacent to a third light-emitting region 302 and an end portion of the second color filter 201 adjacent to the third light-emitting region is larger than the distance L3 between an end portion of the third light-emitting region 302 adjacent to the second light-emitting region 202 and an end portion of the third color filter 301 adjacent to the second light-emitting region 202 when viewed in plan.

The emission spectrum of the third organic electroluminescent element may have a higher luminosity factor than the emission spectrum of the second organic electroluminescent element. The combination of the emission colors of the first, second, and third organic electroluminescent elements may be, for example, a combination of a green emission color of the first organic electroluminescent element, a blue emission color of the second organic electroluminescent element, and a red emission color of the third organic electroluminescent element.

Each of the first organic electroluminescent element 100, the second organic electroluminescent element 200, and the third organic electroluminescent element 300 may be regarded as a subpixel, and the three subpixels may be regarded as one main pixel. The additive color mixing by means of these subpixels enables full-color display.

Any of patterns such as a stripe pattern, a square pattern, a delta pattern, and the Bayer pattern may be used for the planar arrangement of the first organic electroluminescent element 100, the second organic electroluminescent element 200, and the third organic electroluminescent element 300. The matrix arrangement of the main pixels results in an organic electroluminescent display device with a large number of pixels.

Structure of Organic Electroluminescent Element According to Embodiment

The substrate 1 may be composed of any material that can support the lower electrode 2, the organic compound layer 3, and the upper electrode 4. Examples thereof include glasses, plastics, and silicon. For example, a switching element such as a transistor, wiring, and an interlayer dielectric film (not illustrated) may be provided on the substrate 1.

The lower electrode 2 of the first organic electroluminescent element 100 is electrically isolated from the lower electrode 2 of the second organic electroluminescent element 200. Each lower electrode 2 may be composed of a metal material having a visible-light reflectance of 50% or more from the viewpoint of achieving good luminous efficiency. Specifically, a metal, such as Al or Ag, or an alloy of the metal and an additive such as Si, Cu, Ni, Nd, or Ti can be used. A reflective electrode may include a barrier layer on a surface on the outgoing light side. The barrier layer may be composed of a metal such as Ti, W, Mo, or Au, an alloy thereof, or a transparent conductive oxide such as ITO or IZO. To optimize optical interference, the film thickness of the transparent conductive oxide may differ between the first organic electroluminescent element 100 and the second organic electroluminescent element 200.

The organic compound layer 3 extends over the lower electrodes of the first and second organic electroluminescent elements and can be formed by a known technique such as a vapor deposition method or spin coating. It can be said that the fact that the organic compound layer extends over the multiple lower electrodes indicates that the organic compound layer is a common layer on the multiple lower electrodes. In other words, the organic compound layer can be said to be continuously disposed. The term "continuously disposed" indicates that the organic compound layer is disposed substantially uninterruptedly. The organic compound layer is not necessarily formed in a continuous process.

The organic compound layer 3 includes at least a light-emitting layer and may be formed of multiple layers. Examples of the multiple layers include a hole injection layer, a hole transport layer, an electron blocking layer, a light-emitting layer, a hole blocking layer, an electron transport layer, and an electron injection layer. Each of the layers is not limited to a layer composed of an organic compound alone and may contain an inorganic compound. In the case where light is mainly emitted from the organic compound, the element can be called an organic electroluminescent element.

The recombination of holes injected from an anode with electrons injected from a cathode in the light-emitting layer allows white light to be emitted from the light-emitting layer in the organic compound layer. The light-emitting layer may be formed of multiple layers. Any of the light-emitting layers may contain a red-light-emitting material, a green-light-emitting material, and a blue-light-emitting material. The emission colors are mixed together to generate white light. Any of the light-emitting layers may contain light-emitting materials in complementary color relationship, such as a blue-light-emitting material and a yellow-light-emitting material.

The electron injection layer (not illustrated) may be disposed between the organic compound layer 3 and the upper electrode 4. The electron injection layer may contain a compound having strong electron-donating properties. Examples of the compound having strong electron-donating properties include metals having strong electron-donating properties, such as alkali metals, e.g., lithium and cesium, alkaline-earth metals, e.g., calcium and barium, and compounds thereof. Further examples thereof include organometallic complexes in which the metals and organic compounds are bonded together. These materials may be used alone in the form of a single layer or used in the form of a mixture layer composed of a mixture of the material and the organic compound used for the electron injection layer.

The upper electrode 4 extends over the organic compound layer 3 of the first and second organic electroluminescent elements and transmits light. The upper electrode 4 may be composed of a semi-transmissive material that transmits a portion of the light reached its surface and reflects another portion of the light, i.e., trans-reflective material. Examples of the material of the upper electrode 4 include transparent materials such as transparent conductive oxides; and semi-transmissive materials such as elemental metals, e.g., aluminum, silver, and gold, alkali metals, e.g., lithium and cesium, alkaline-earth metals, e.g., magnesium, calcium, and barium, and alloy materials containing these metal materials. In particular, the semi-transmissive material, an alloy mainly containing magnesium or silver may be used. The upper electrode 4 may have a multilayer structure composed of the foregoing materials as long as it has a specific transmittance.

In this embodiment, the lower electrode 2 serves as an anode, and the upper electrode 4 serves as a cathode. Alternatively, the lower electrode 2 may serve as a cathode, and the upper electrode 4 may serve as an anode.

The organic electroluminescent display device according to the embodiment may include the insulating layer 5 between the first and second organic electroluminescent elements 100 and 200 adjacent to each other. The insulating layer 5 covers the end portions of the lower electrodes 2 of the first and second organic electroluminescent elements 100 and 200 and includes aperture portions at which the portions of the lower electrodes are exposed.

The insulating layer 5 may be disposed in order to accurately provide the first light-emitting region 102 and the second light-emitting region 202 that have a desired shape. In the case where the insulating layer 5 is not provided, the first light-emitting region 102 and the second light-emitting region 202 are defined by the lower electrode 2.

The insulating layer 5 may be composed of an inorganic material such as silicon nitride (SiN), silicon oxynitride (SiON), or silicon oxide (SiO). The insulating layer can be formed by a known technique such as a sputtering method or a chemical vapor deposition method (CVD method). The insulating layer 5 may be composed of an organic material such as an acrylic resin or a polyimide resin.

The organic electroluminescent display device according to the embodiment may include the protective layer 6. The protective layer may cover the first organic electroluminescent element 100 and the second organic electroluminescent element 200. The protective layer 6 may contain an inorganic material that transmits light and that has extremely low permeability to oxygen and moisture from the outside. In particular, for example, silicon nitride (SiN), silicon oxynitride (SiON), silicon oxide (SiOx), aluminum oxide ($Al_2O_3$), or titanium oxide ($TiO_2$) may be used.

The protective layer 6 can be formed by a sputtering method, a chemical vapor deposition method (CVD method), or an atomic layer deposition method (ALD method). The protective layer 6 may have either a single-layer structure or a multilayer structure of the foregoing materials as long as it has sufficient moisture barrier performance. The protective layer 6 may have a multilayer structure composed of the foregoing inorganic material and an organic material. As the organic material, a known organic material, such as resin or polymer compound, may be used. The protective layer 6 may have irregularities conforming to the shape of a structure formed before the formation of the protective layer 6. The protective layer may also be called a "sealing layer". In the case of being called the sealing layer, the ability to seal the display device need not necessarily be perfect.

The organic electroluminescent display device according to the embodiment may include a planarization layer 7 between the protective layer 6 and the color filters. The planarization layer 7 is composed of a material that transmits light and may be composed of an inorganic material or an organic material. In the case where the planarization layer 7 is composed of a resin material, because the planarization layer 7 has smaller irregularities on the outgoing light side than the protective layer, scattered light due to the irregularities of the protective layer 6 can be reduced. The planarization layer can also be called a coating layer.

The planarization layer may be composed of an organic material such as an acrylic resin, an epoxy resin, or a silicone resin. The planarization layer can be formed by a known method such as a coating method or polymerization deposition.

The organic electroluminescent display device according to the embodiment may include a filling layer 8 disposed on the outgoing light side of the color filters. The filling layer 8 transmits light, is composed of an organic material such as an acrylic resin, an epoxy resin, or a silicone resin, and may be flat on the outgoing light side thereof. In particular, in the case where an opposite substrate described below is not disposed, the filling layer 8 may be flat on the outgoing light side thereof. A planarization layer may be disposed between the color filters and the filling layer.

The filling layer and the planarization layer disposed between the color filters and the protective layer may be composed of the same material. The filling layer and the relevant planarization layer may be in contact with each other outside a display region, i.e., at the end portion of the display device. The layers composed of the same material may be used because of high adhesion therebetween.

The organic electroluminescent display device according to the embodiment may include an opposite substrate 9 disposed on the outgoing light side of the filling layer 8. The opposite substrate 9 is composed of a material that transmits light. The opposite substrate 9 is formed of, for example, a glass substrate or a plastic substrate and may be flat on the outgoing light side thereof.

The color filters according to the embodiment may be directly disposed on the protective layer or the planarization layer. An opposite substrate including color filters formed in advance may be combined so as to face away from the first organic electroluminescent element and the second organic electroluminescent element. In the case where a transparent substrate including color filters is combined, no gap may be formed between the color filters and the first and second organic electroluminescent elements. The gap can be eliminated by filling the gap with a known resin.

The color filters are formed by applying a color resist and patterning the resist using lithography. The color resist is composed of, for example, a photocurable resin. A portion of the color resist irradiated with ultraviolet radiation is cured to form a pattern.

Figure 9:
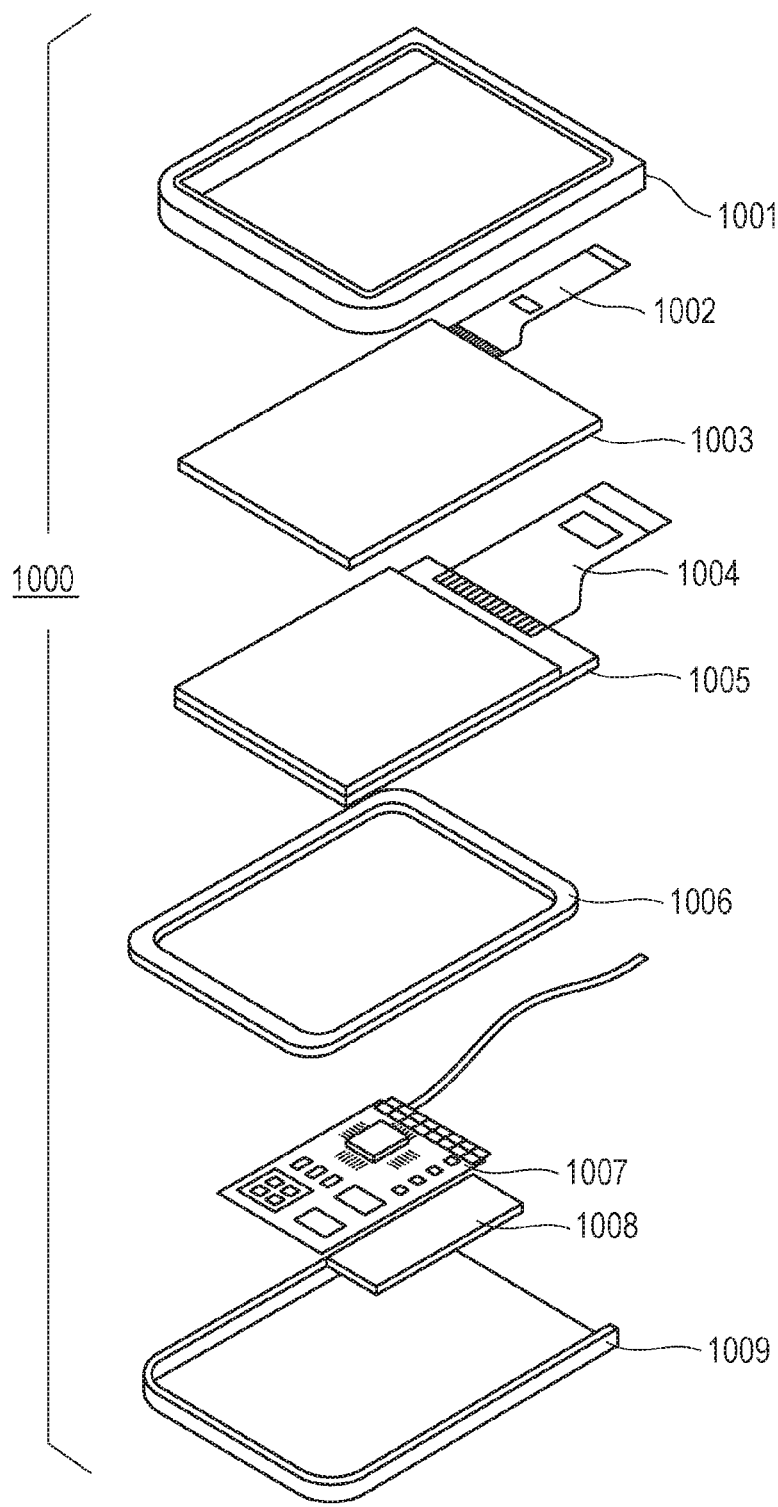
FIG. 9 is a schematic diagram of an example of a display device according to an embodiment.

FIG. 9 is a schematic diagram of an example of a display device according to an embodiment of the present invention. A display device 1000 may include a touch panel 1003, a display panel 1005, a frame 1006, a circuit substrate 1007, and a battery 1008 between an upper cover 1001 and a lower cover 1009. The touch panel 1003 and the display panel 1005 are connected to flexible printed circuit (FPC) boards 1002 and 1004, respectively. The circuit substrate 1007 includes a transistor formed by printing. The battery 1008 need not be provided unless the display device is a portable device. Even If the display device is a portable device, the battery 1008 need not be provided at this position.

The display device according to the embodiment may be used for a display unit of an image pickup apparatus including an optical unit having multiple lenses and an image pickup element that receives light passing through the optical unit. The image pickup apparatus may include a display unit that displays information acquired by the image pickup element. The display unit may be a display unit exposed to the outside of the image pickup apparatus or may be a display unit disposed in a viewfinder. The image pickup apparatus may be a digital camera or a digital camcorder.

Figure 10:
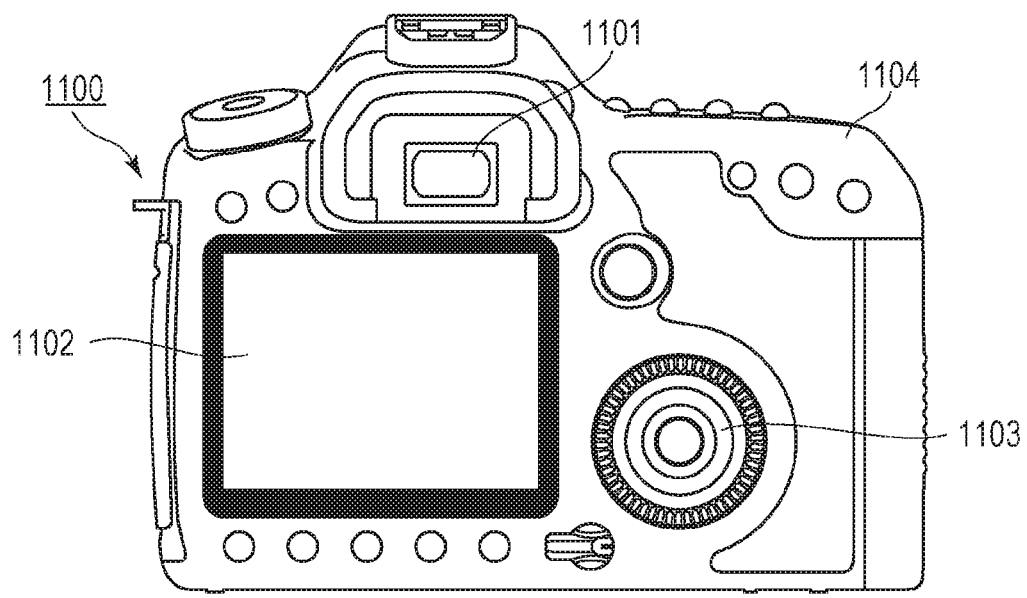
FIG. 10 is a schematic diagram of an example of an image pickup apparatus according to an embodiment.

FIG. 10 is a schematic diagram illustrating an example of an image pickup apparatus according to an embodiment. An image pickup apparatus 1100 may include a viewfinder 1101, a rear display 1102, a casing 1103, and an operation unit 1104. The viewfinder 1101 may include the display device according to the embodiment. In this case, the display device may display environmental information, imaging instructions, and so forth in addition to an image to be captured. The environmental information may include the intensity of external light, the direction of external light, the moving speed of a subject, and the possibility that the object is shielded by a shield.

The timing suitable for imaging is only for a short time; thus, the information may be displayed as soon as possible. Accordingly, the display device including the organic electroluminescent element according to an embodiment of the present invention may be used because of its high response time. The display device including the organic electroluminescent element may be used for these components, rather than liquid crystal displays.

The image pickup apparatus 1100 includes an optical unit (not illustrated). The optical unit includes multiple lenses and forms an image on the image pickup element in the casing 1103. The focal point can be adjusted by adjusting the relative position of the multiple lenses. This operation can also be done automatically.

The display device according to the embodiment may be used for the display unit of a mobile terminal. In that case, the display device may have both a display function and an operation function. Examples of the mobile terminal include mobile phones such as smartphones, tablets, and head-mounted displays.

The display device according to the embodiment may further include a control unit that controls a display image.

Figure 11:
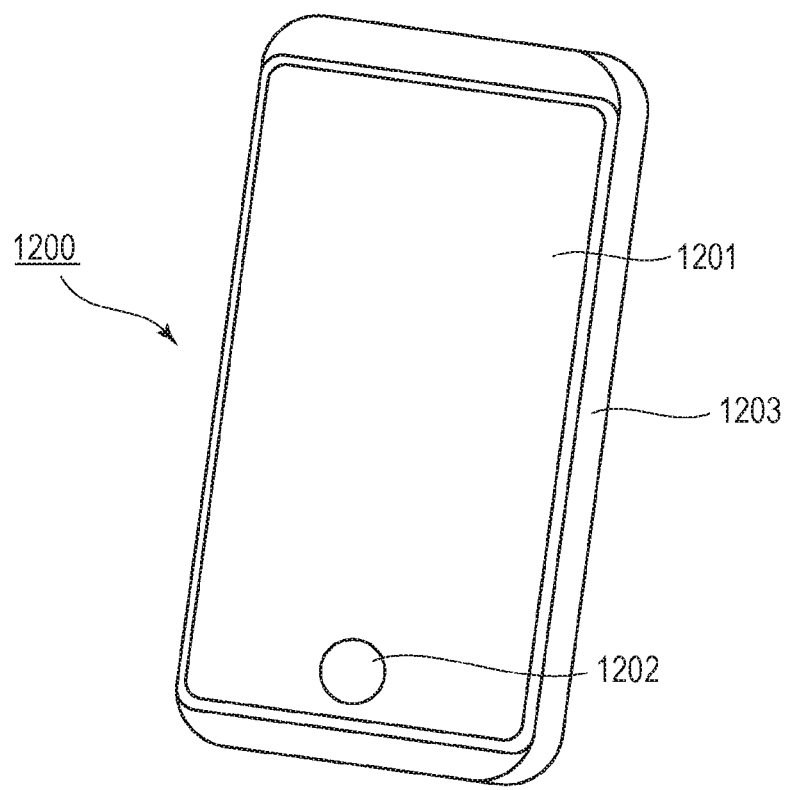
FIG. 11 is a schematic diagram of an example of a portable apparatus according to an embodiment.

FIG. 11 is a schematic diagram of an example of an electronic apparatus according to an embodiment. An electronic apparatus 1200 includes a display unit 1201, an operation unit 1202, and a casing 1203. The casing 1203 may accommodate a circuit, a printed-circuit board including the circuit, a battery, and a communication unit. The operation unit 1202 may be a button or a touch panel-type reactive unit. The operation unit may be a biometric recognition unit that recognizes a fingerprint to release the lock or the like. The electronic apparatus including the communication unit can also be referred to as a communication apparatus.

Figure 12A:
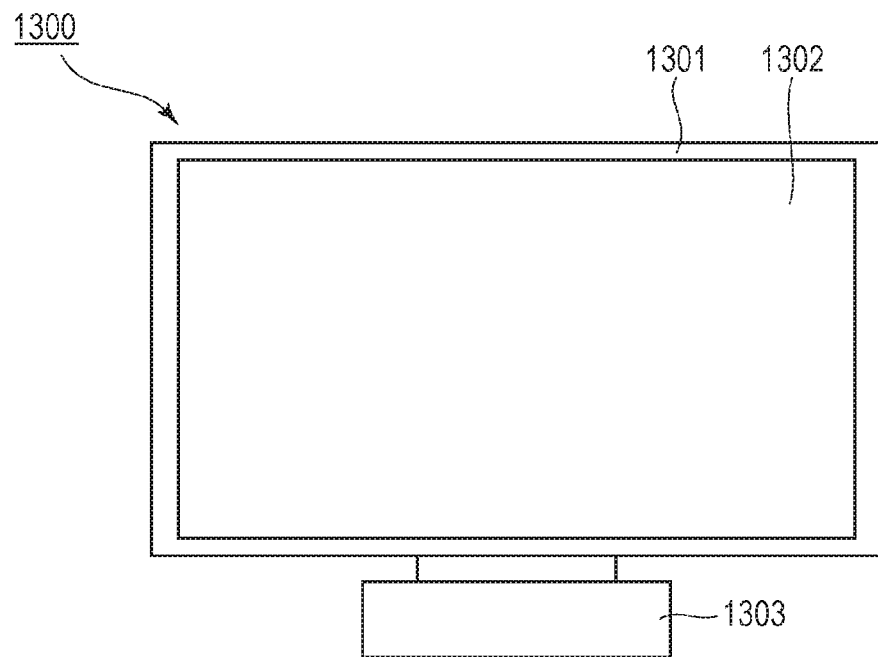
FIG. 12A is a schematic diagram of an example of a display device according to an embodiment, and FIG. 12B a schematic diagram of an example of a foldable display device.
Figure 12B:
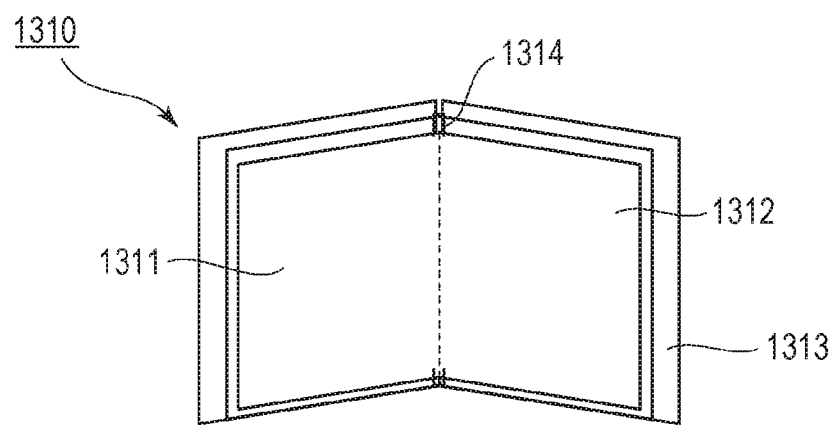

FIGS. 12A and 12B are schematic diagrams illustrating examples of display devices according to embodiments. FIG. 12A illustrates a display device such as a television monitor or a PC monitor. A display device 1300 includes a frame 1301 and a display portion 1302. The electroluminescent element according to an embodiment may be used for the display portion 1302.

The display device 1300 includes a base 1303 that supports the frame 1301 and the display portion 1302. The base 1303 is not limited to the structure illustrated in FIG. 12A. The lower side of the frame 1301 may also serve as a base.

The frame 1301 and the display portion 1302 may be curved. The radius of curvature may be 5,000 mm or more and 6,000 mm or less.

FIG. 12B is a schematic diagram illustrating another example of a display device according to an embodiment. A display device 1310 illustrated in FIG. 12B is foldable and is what is called a foldable display device. The display device 1310 includes a first display portion 1311, a second display portion 1312, a casing 1313, and an inflection point 1314. The first display portion 1311 and the second display portion 1312 may include the electroluminescent element according to an embodiment. The first display portion 1311 and the second display portion 1312 may be a single, seamless display device. The first display portion 1311 and the second display portion 1312 can be divided from each other at the inflection point. The first display portion 1311 and the second display portion 1312 may display different images. Alternatively, a single image may be displayed in the first and second display portions.

In the organic electroluminescent element according to an embodiment, the luminance can be controlled by a switching element such as a thin-film transistor (TFT). The multiple organic electroluminescent elements can be provided in one plane to display an image at respective luminance levels. The switching element according to the embodiment is not limited to the TFT and may be a transistor, a metal-insulator-metal (MIM) element, or an active matrix driver provided on a substrate such as a Si substrate. The active matrix driver may also be provided in the substrate. This is selected in accordance with the level of resolution. For example, in the case of a size of 1 inch and a resolution of about QVGA, the organic electroluminescent element may be provided on a Si substrate. By driving the display device including the organic electroluminescent element according to the embodiment, an image can be stably displayed with good image quality even for a long time.

EXAMPLES

Example 1

A display device having the structure illustrated in FIG. 1 was produced as described below.

The lower electrodes 2 composed of aluminum were formed by patterning on the substrate 1. The insulating layer 5 was formed between the lower electrodes. The insulating layer 5 was composed of silicon oxide. The insulating layer 5 had a thickness of 65 nm. The aperture portions of the insulating layer in pixels had the same size. The distance between pixel apertures of adjacent pixels was 1.4 µm. The distance between the lower electrodes was 0.6 µm.

An organic compound layer was formed on the lower electrodes 2. Specifically, a 3-nm-thick hole injection layer composed of Compound 1 was formed. A 15-nm-thick hole transport layer composed of Compound 2 was formed. A 10-nm-thick electron blocking layer composed of Compound 3 was formed.

A 10-nm-thick first light-emitting layer was formed, the first light-emitting layer being composed of 97% by weight Compound 4 serving as a host material and 3% by weight Compound 5 serving as an emissive dopant. A 10-nm-thick second light-emitting layer was formed, the second light-emitting layer being composed of 98% by weight Compound 4 serving as a host material, 1% by weight Compound 5 serving as an emissive dopant, and 1% by weight Compound 6 serving as an emissive dopant. A 110-nm-thick electron transport layer composed of Compound 8 was formed. A 1-nm-thick electron injection layer composed of lithium fluoride was formed.

Compound 1

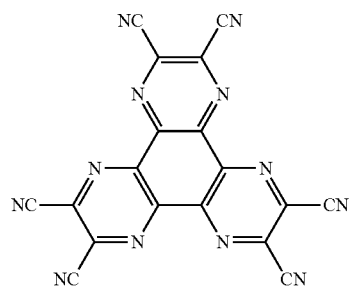

Compound 2

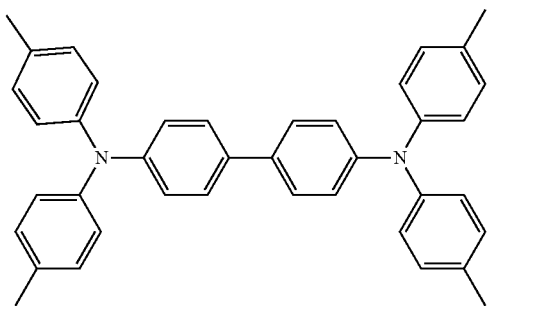

Compound 3

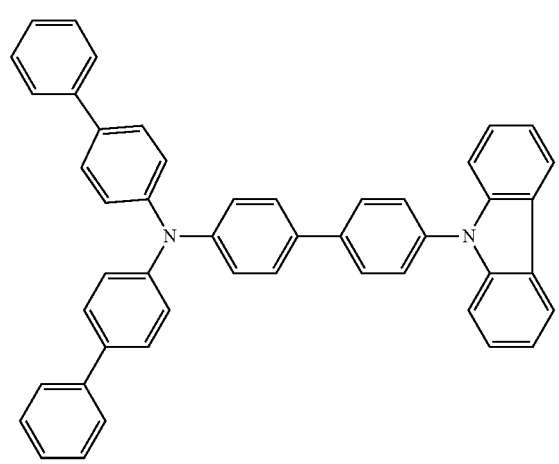

Compound 4

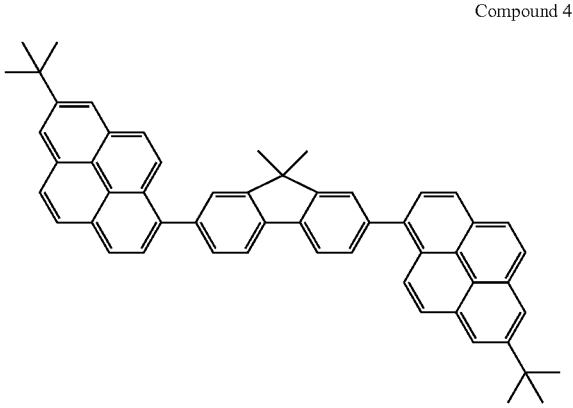

Compound 5

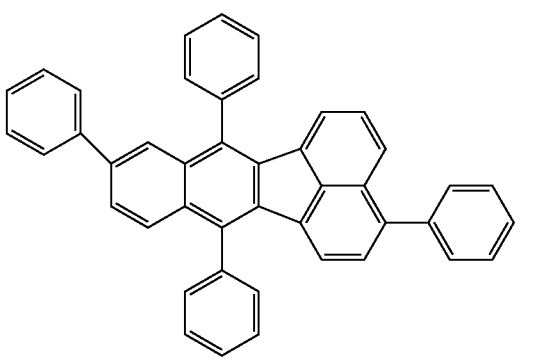

-continued

Compound 6

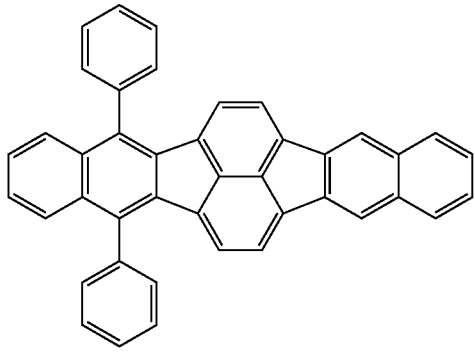

Compound 7

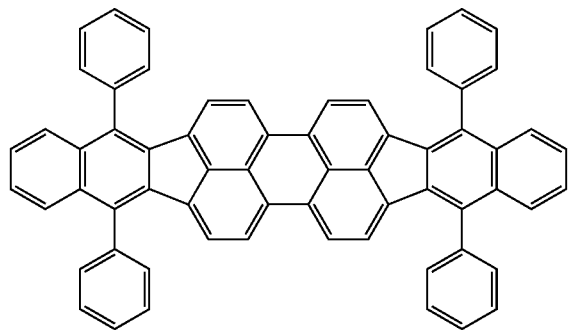

Compound 8

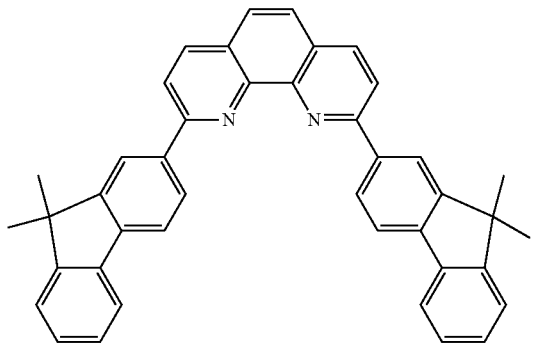

A 10-nm-thick upper electrode composed of a MgAg alloy was formed, the ratio of Mg to Ag being 1:1.

A SiN film having a thickness of 2 m was formed as a protective layer by a CVD method. A planarization layer having a thickness of 300 nm was formed on the SiN film by spin coating.

Three color filters of red, green, and blue were formed on the planarization layer. The green color filter was provided for a first organic electroluminescent element. The distance L1 between an end portion of a first light-emitting region adjacent to a second light-emitting region and an end portion of a first color filter adjacent to the second light-emitting region was 0.8 μm.

The blue color filter was provided for a third organic electroluminescent element. The distance L4 between an end portion of a third light-emitting region adjacent to the second light-emitting region and an end portion of a third color filter adjacent to the second light-emitting region was 0.8 μm. The red color filter was provided for a second organic electroluminescent element. The distance L2 between an end portion of the second light-emitting region adjacent to the first light-emitting region and an end portion of a second color filter adjacent to the first light-emitting region was 1.0 μm.

The opposite substrate 9 was formed of a glass substrate having a flat upper surface and a flat lower surface. The filling layer 8 composed of a photocurable acrylic resin was formed between the opposite substrate 9 and the color filters.

Example 2

A display device was produced as in Example 1, except that the distance L2 between the end portion of the second light-emitting region adjacent to the first light-emitting region and the end portion of the second color filter adjacent to the first light-emitting region was 1.4 μm.

Comparative Example 1

A display device was produced as in Example 1, except that the distance L2 between the end portion of the second light-emitting region adjacent to the first light-emitting region and the end portion of the second color filter adjacent to the first light-emitting region was 0.8 μm.

Comparative Example 2

A display device was produced as in Comparative example 1, except that the distance L1 between the end portion of the first light-emitting region adjacent to the second light-emitting region and the end portion of the first color filter adjacent to the second light-emitting region was 0.9 μm.

Evaluation Result of Examples and Comparative Examples

The color gamut was evaluated by applying a current density of 100 mA/cm$^2$ to each of the first organic electroluminescent element, the second organic electroluminescent element, and the third organic electroluminescent element of each organic electroluminescent display device and detecting light emission with a spectral radiance meter in the direction perpendicular to the substrate.

Table 3 presents comparisons among the color gamuts in Examples 1 and 2 and Comparative examples 1 and 2. The color gamut is expressed in percentage with respect to the sRGB area in the (u', v') chromaticity space.

Table 3 indicates that in each of Examples 1 and 2 of the present invention, the color gamut is improved, in other words, the color purity of each emission color is improved, compared with Comparative example 1.

Figure 6:
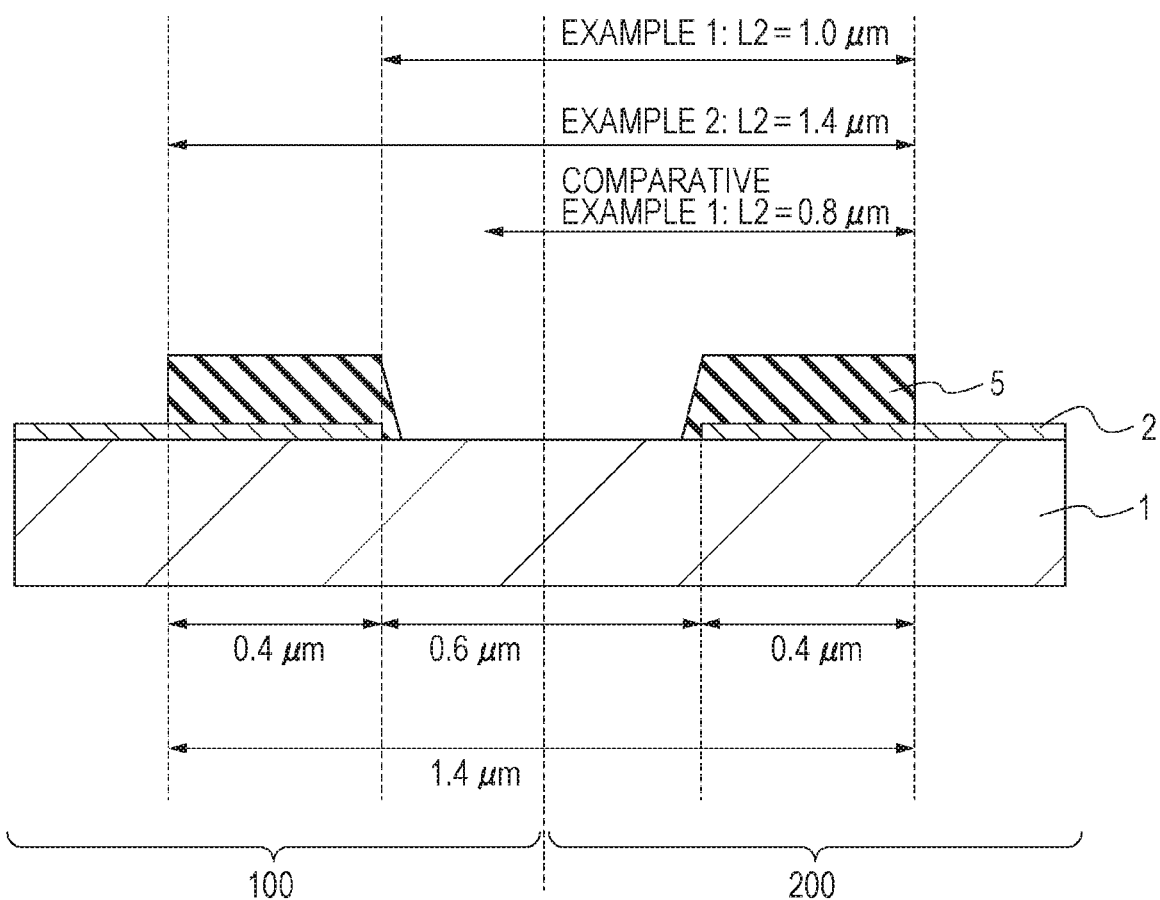
FIG. 6 illustrates the relationship between examples and inclined portions in an organic electroluminescent display device according to an embodiment of the present invention.
Figure 7:
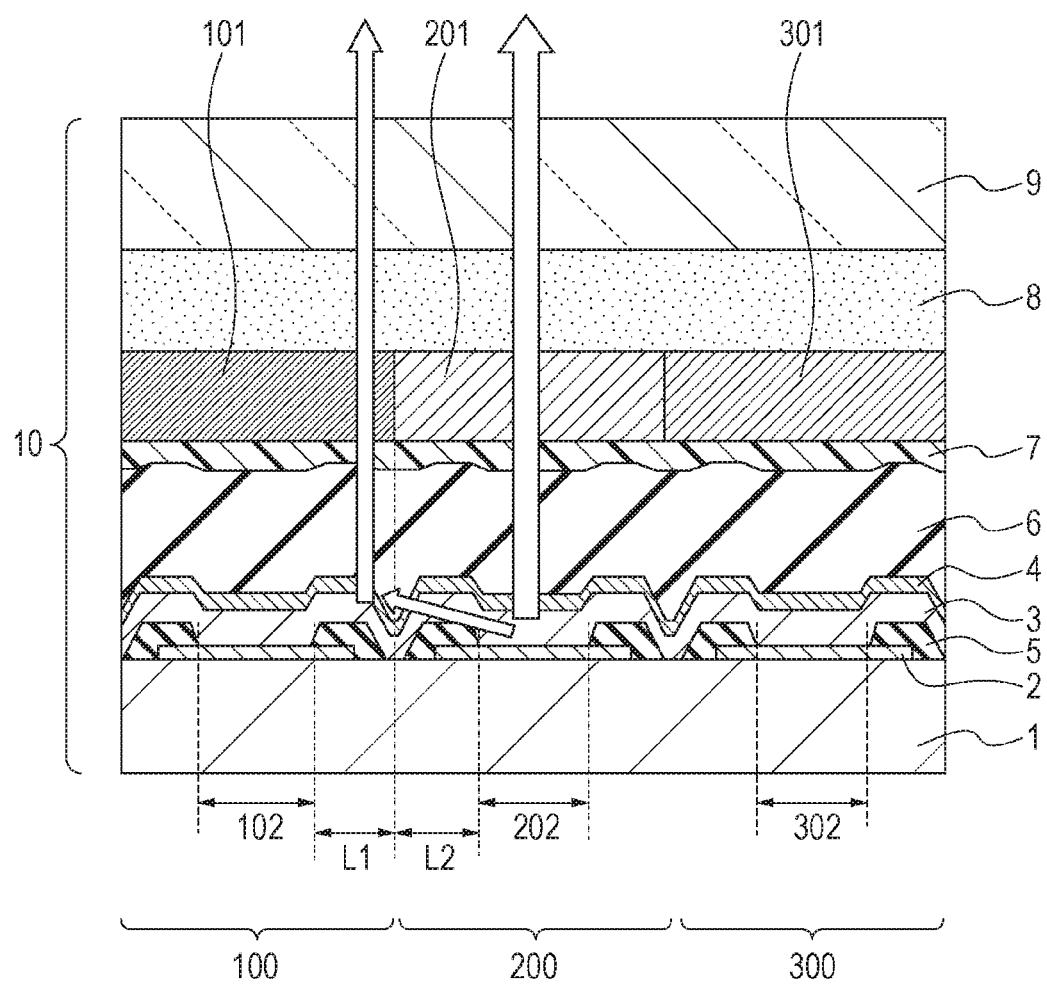
FIG. 7 is a cross-sectional view illustrating an example of a display device in the related art.

FIG. 6 illustrates the relationships among L2 of Examples 1 and 2 and Comparative example 1, and the lower electrodes 2 and the insulating layer 5 of the first and second organic electroluminescent elements 100 and 200. An end portion of the second color filter in Example 1 is overlapped with an end portion of the lower electrode of the first organic electroluminescent element in a plan view. In Example 1, color mixture due to stray light at the end portion of the lower electrode of the first organic electroluminescent element can be seemingly reduced.

In Example 2, the end portion of the second color filter is overlapped with the aperture portion of the insulating layer of the first organic electroluminescent element in a plan view. In Example 2, color mixture due to stray light at the aperture portion of the insulating layer of the first organic electroluminescent element can also be reduced, thus enhancing the effect of improving the color gamut.

In Comparative example 2, even when the first color filter for light having a high luminosity factor was increased in size, the color gamut was not improved.

TABLE 3

|  | L1 [μm] | L2 [μm] | Color gamut |
|---|---|---|---|
| Example 1 | 0.8 | 1.0 | 94.4 |
| Example 2 | 0.8 | 1.4 | 95.3 |
| Comparative example 1 | 0.8 | 0.8 | 93.5 |
| Comparative example 2 | 0.9 | 0.8 | 93.5 |

As described above, in the organic electroluminescent display device according to an embodiment of the present invention, the overlapping distance L2 of the color filter for light having a low luminosity factor is larger than the overlapping distance L1 of the color filter for light having a high luminosity factor. This enables an improvement in the color purity of the emission color.

According to an embodiment of the present invention, an organic electroluminescent display device having a reduced decrease in aperture ratio and a high color gamut can be provided.

While the present invention has been described with reference to exemplary embodiments, it is to be understood that the invention is not limited to the disclosed exemplary embodiments.

What is claimed is:

1. A display device, comprising:
a substrate;
a first electroluminescent element;
a second electroluminescent element, disposed next to the first electroluminescent element; and
an insulating layer disposed between the first electroluminescent element and the second electroluminescent element,
the first electroluminescent element including:
a lower electrode;
a light-emitting layer;
an upper electrode; and
a first color filter, disposed in that order from the substrate,
the second electroluminescent element including:
a lower electrode;
a light-emitting layer;
an upper electrode; and
a second color filter, disposed in that order from the substrate,
wherein the insulating layer covers the lower electrode of the first electroluminescent element and the second luminescent element and the insulating layer comprises a first recess including a first inclined portion and a second inclined portion closer to the lower electrode of the second luminescent element than the first inclined portion,
wherein the display device includes an overlapping region where the first color filter and the second color filter overlap each other in a plan view of the display device when viewed in a direction perpendicular to a main surface of the substrate,
wherein light transmitted through the first color filter has a higher luminosity factor than light transmitted through the second color filter,
wherein L2 is larger than L1, where L2 is the distance between an end portion of a light-emitting region of the second electroluminescent element adjacent to the first color filter and an end portion of the second color filter adjacent to the first electroluminescent element, and L1 is the distance between an end portion of a light-emitting region of the first electroluminescent element adjacent to the second color filter and an end portion of the first color filter adjacent to the second electroluminescent element, and
wherein in the plan view, the overlapping region overlaps the first inclined portion.

2. The display device according to claim 1, wherein the insulating layer covers an end portion of each of the lower electrodes,
wherein a light-emitting region of the first electroluminescent element is a region of the lower electrode of the first electroluminescent element, the region of the lower electrode not being covered by the insulating layer.

3. The display device according to claim 1, wherein the overlapping region does not overlap the second inclined portion.

4. The display device according to claim 1, further comprising a third electroluminescent element next to the second luminescent element,
wherein the third electroluminescent element includes:
a lower electrode:
a light emitting-layer;
an upper electrode; and
a third color filter, disposed in that order from the substrate, and
wherein L4 is larger than L3, where L4 is the distance between an end portion of a light-emitting region of the second electroluminescent element adjacent to the third color filter and an end portion of the second color filter adjacent to the third electroluminescent element, and L3 is the distance between an end portion of a light-emitting region of the third electroluminescent element adjacent to the second color filter and an end portion of the third color filter adjacent to the second electroluminescent element.

5. The display device according to claim 4, wherein the first color filter is arranged to transmit green light, the second color filter is arranged to transmit red light, and the third color filter is arranged to transmit blue light.

6. The display device according to claim 4, further comprising a second insulating layer covering the lower electrode of the second luminescent element and the lower electrode of the third electroluminescent element and a second overlapping region where the first color filter and the third color filter overlap each other in a plan view of the display device when viewed in the direction perpendicular to the main surface of the substrate,
wherein the second insulating layer comprises a second recess including a third inclined portion and a fourth inclined portion closer to the lower electrode of the first electroluminescent element than the third inclined portion, and
wherein the second overlapping region overlaps the third inclined portion.

7. The display device according to claim 6, wherein the second overlapping region overlaps the fourth inclined portion.

8. A display apparatus, comprising:
a frame; and
a display portion,
wherein the display portion includes the display device according to claim 1.

9. An image pickup apparatus, comprising:
an optical unit having multiple lenses;
an image pickup element arranged to receive light passing through the optical unit; and
a display portion arranged to display an image to be captured by the image pickup element,
wherein the display portion includes the display device according to claim 1.

10. An electronic apparatus, comprising:
a casing;
a communication unit; and
a display portion,
wherein the display portion includes the display device according to claim 1.

* * * * *